United States Patent [19]

Cho et al.

[11] Patent Number: 5,561,309
[45] Date of Patent: Oct. 1, 1996

[54] STRUCTURE OF A CHARGE STORAGE ELECTRODE

[75] Inventors: Sung C. Cho, Suwon; Kyung D. Yoo, Seoul, both of Rep. of Korea

[73] Assignee: Hyundai Electronics Industries Co., Ltd., Kyungki-Do, Rep. of Korea

[21] Appl. No.: 363,902

[22] Filed: Dec. 27, 1994

[30] Foreign Application Priority Data

Dec. 27, 1993 [KR] Rep. of Korea ................... 93-29781

[51] Int. Cl.⁶ .................................................. H01L 27/108
[52] U.S. Cl. ........................ 257/306; 257/308; 257/309; 257/534; 361/303
[58] Field of Search ................................ 257/296, 298, 257/301, 304–309, 311, 532, 534, 773, 774; 361/303; 365/149

[56] References Cited

U.S. PATENT DOCUMENTS 5,238,862  8/1993  Blalock et al.
5,268,322  12/1993  Lee et al. ................... 437/52
5,371,701  12/1994  Lee et al. ................... 257/306

*Primary Examiner*—Minhloan Tran
*Attorney, Agent, or Firm*—Fish & Richardson P.C.

[57] ABSTRACT

A charge storage electrode structure and the manufacturing method therefor. The present invention features forming two oxide patterns having viscous property at certain temperatures on a barrier layer as rectangular bar-shaped patterns and applying heat to two oxide patterns to transform the two oxide patterns to cylindrical oxide patterns; depositing polysilicon layer on the cylindrical oxide patterns; etching each end of the portions of the polysilicon layer and removing the two oxide patterns; so as to provide a charge storage electrode structure having at least two conduits which is formed with a polysilicon. The charge storage electrode structure according to the present invention has an increased effective surface area and is manufactured by a relatively simple method facilitating the manufacture of highly integrated semiconductor device.

4 Claims, 3 Drawing Sheets

STRUCTURE OF A CHARGE STORAGE ELECTRODE

FIELD OF THE INVENTION

The present invention relates to the structure and manufacturing method of a charge storage electrode, and more particularly to the structure and manufacturing method of a charge storage electrode which can increase the capacitance in a limited area by forming a plurality of conduits formed with an oxide having a viscous flow property.

INFORMATION DISCLOSURE STATEMENT

Generally, as a semiconductor device becomes more integrated, the unit cell area decreases. However, a minimum capacitance is needed to operate the device notwithstanding the reduction in the unit cell area.

A variety of charge storage electrodes having a three dimensional structure can solve this capacitance problem. However, since these three dimensional charge storage electrodes are difficult to manufacture, much effort has been made to simplify the manufacturing processes for manufacturing the electrodes.

SUMMARY OF THE INVENTION

An object of the invention is to provide a charge storage electrode structure which increases capacitance in a limited area and a simplified manufacturing method.

In order to achieve these objects, the present invention provides a charge storage electrode structure having at least two are which is formed with a conductivity material.

Further, the present invention provides a manufacturing method of the charge storage electrode, comprising the steps of:

forming an insulating layer on a silicon substrate on which a doped region is formed;

forming an etching barrier layer on the insulating layer;

forming at least two oxide patterns on the etching barrier layer;

transforming a shape of the two oxide patterns by a heat treatment process, thereby forming cylindrical oxide patterns;

forming a contact hole on the doped region by etching a portion of the etching barrier layer and the insulating layer using a charge storage electrode contact mask;

forming a polysilicon layer on the surfaces of the contact hole, the etching barrier layer and the cylindrical oxide patterns;

etching the exposed portions of the polysilicon layer by an etching process using a charge storage electrode mask, thereby exposing a portion at both ends of the cylindrical oxide patterns;

removing the cylindrical oxide patterns by a wet etching process, thereby forming through holes; and etching exposed portions of said etching barrier layer to form a charge storage electrode having at least two conduits.

BRIEF DESCRIPTION OF THE DRAWINGS

For a full understanding of the nature and objects of the invention, reference should be had to the following detailed description taken in conjunction with the accompanying drawings in which.

DETAILED DESCRIPTION OF THE INVENTION

Figure 1A:
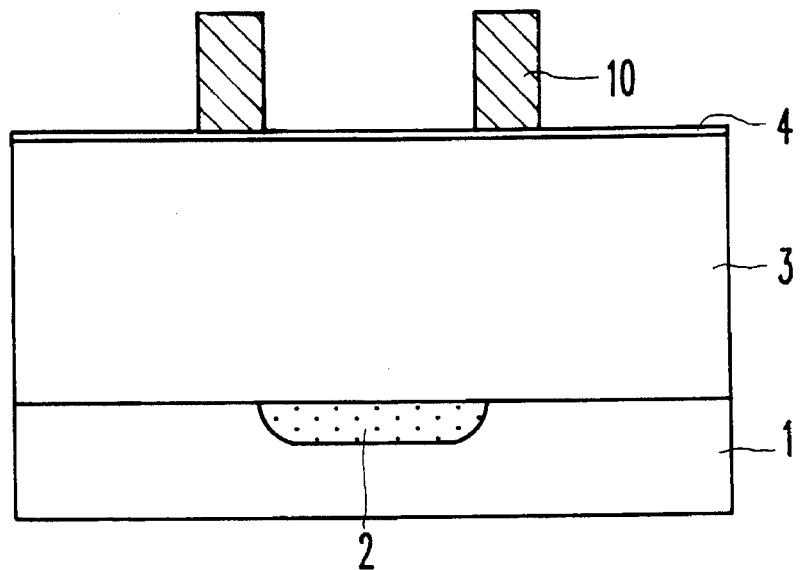
FIGS. 1A to 1F are cross-sectional views illustrating the processes for manufacturing a charge storage electrode of a capacitor according to the present invention.

Referring to FIG. 1A, a doped region 2 is formed on a silicon substrate 1 by an impurity ion implantation process. An insulating layer 3 is formed on the silicon substrate 1 including the doped region 2. An etching barrier layer 4 is formed on the insulating layer 3, and two oxide patterns 10 are formed on the etching barrier layer 4.

The insulating layer 3 is formed with BPSG(Boron Phosphorous Silicate Glass) having a viscous flow property in order to obtain a flat surface.

The etching barrier layer 4 is formed with a polysilicon or nitride with an etching ratio different from the two oxide patterns 10, so that when the two oxide patterns 10 are formed, the removal of the insulating layer 3 from the etching can be avoided.

An oxide having a viscous flow property, such a BPSG, $O_3$-BPSG, BSG(Boron silicate Glass) or PSG(Phosphorous Silicate Glass) is thickly deposited on the etching barrier layer 4, thereafter the two oxide patterns 10 are formed by etching the oxide with an anisotropic etching process. The length of the two oxide patterns 10 is longer than the width of the charge storage electrode region and the two oxide patterns 10 are in form of rectangular bar-shaped. With reference to FIG. 1A, the two oxide patterns 10 are formed parallel to each other on the etching barrier 4. Although the two oxide patterns 10 are formed as illustrated in FIG. 1A, the present invention does not limit the number of patterns, and the more oxide patterns 10 may be formed in an orderly or disorderly position relative to each other.

Figure 1B:
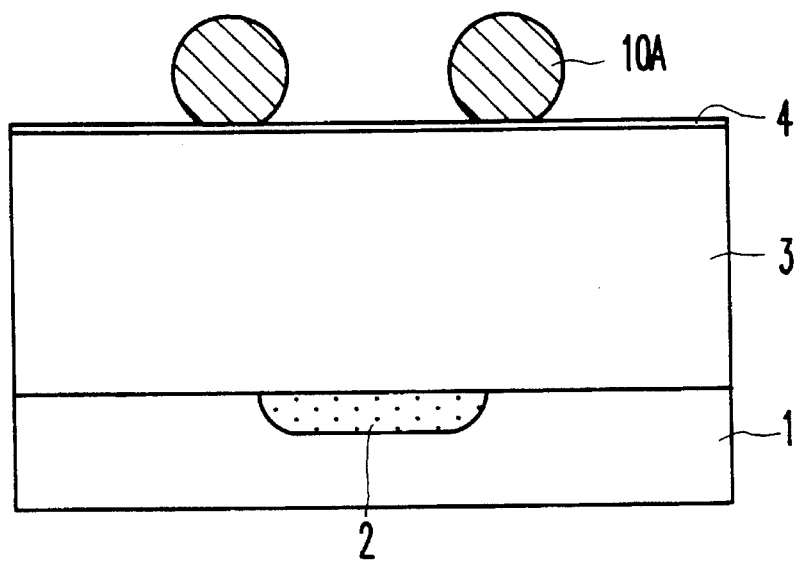

Referring to FIG. 1B, the two oxide patterns 10 are transformed to two cylindrical oxide patterns by a heat treatment.

Since the two oxide patterns 10 have a viscous flow property, the oxide of the two oxide patterns 10 is flowed by a heat treatment at temperatures of 750 to 950 degree Celsius, therefore the rectangular bar-shaped oxide patterns 10 are transformed into the cylindrical oxide patterns 10A which both ends have a curved shape.

The shape of the two cylindrical oxide patterns 10A is determined by the thickness and width of the two oxide patterns 10. The resulting shape of the oxide patterns 10A depends on the ratio of the height to the width of the two oxide patterns 10. The circle-shaped cross-section as shown in FIG. 1B is a result of a height-width ratio of 3:2. If the ratio differ from the 3:2 ratio, an elliptical cross-section may be obtained. Therefore, any desired cross-section can be obtained by changing the height-width ratio of the two oxide patterns 10.

Figure 1C:
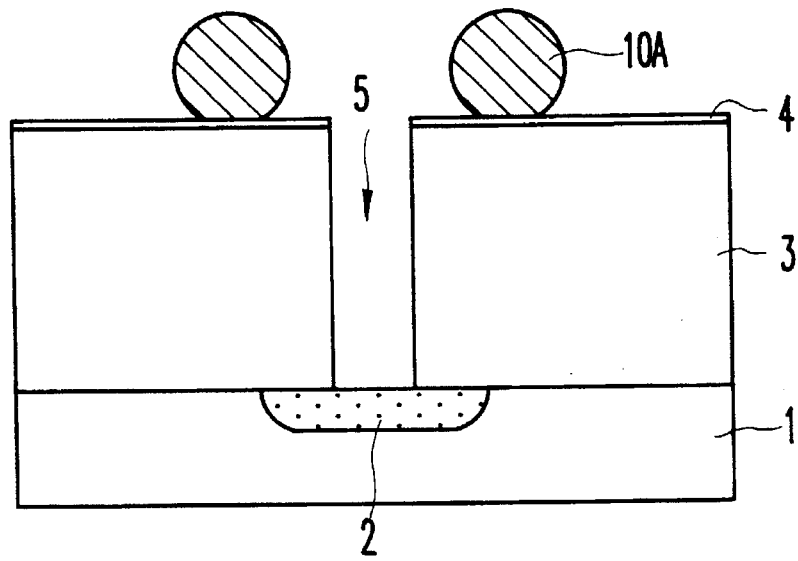

Referring to FIG. 1C, the etching barrier layer 4 and the insulating layer 3 are etched by an anisotropic etching process using a charge storage electrode contact mask so that a part of the doped region 2 is exposed, thereby forming a contact hole 5.

Figure 1D:
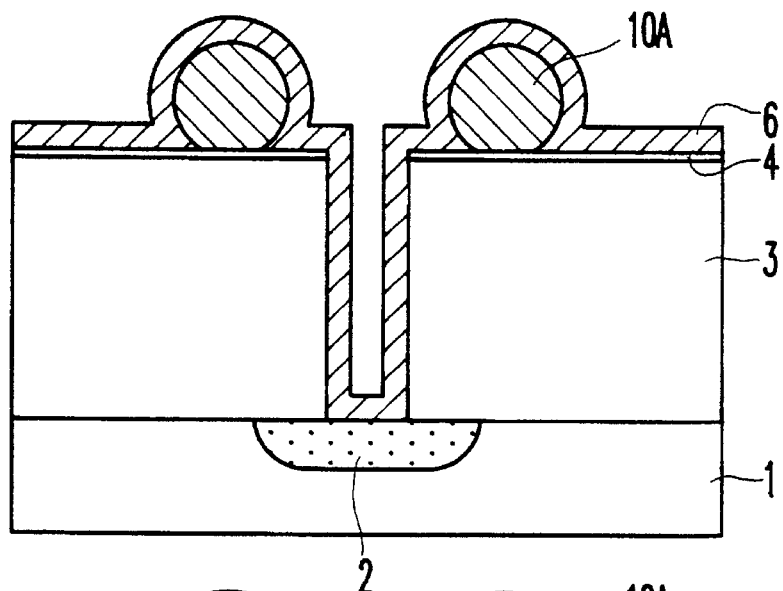

Referring to FIG. 1D, a polysilicon layer 6 is formed on the entire structure constituting the contact hole 5, the cylindrical oxide patterns 10A and the etching barrier layer 4.

In order to prevent a reflowing of the cylindrical oxide patterns 10A during the polysilicon deposit process, the deposit process should be executed at temperatures lower than the temperature at which oxide patterns flow; therefore, the polysilicon layer 6 should be deposited with in-situ phosphorous doped polysilicon at the temperature of 500 to 600 degree Celsius.

Figure 1E:
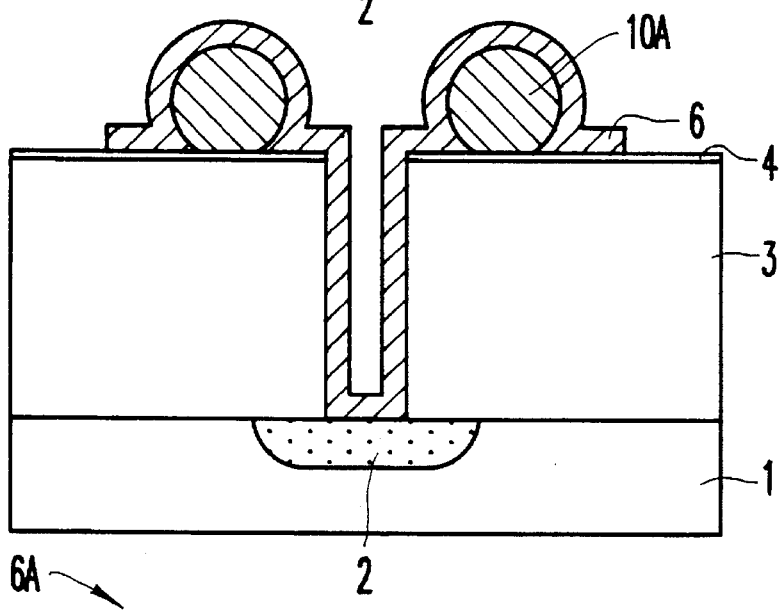

Referring to FIG. 1E, the portions of the polysilicon layer 6 are etched by an anisotropic etching process using a charge storage electrode mask. The anisotropic etching process is executed until the etching barrier layer 4 is exposed. At this time, a portion at both ends of the cylindrical oxide patterns 10A is exposed. It is important to etch only the polysilicon layer 6 without damaging the insulating layer 4.

Figure 1F:
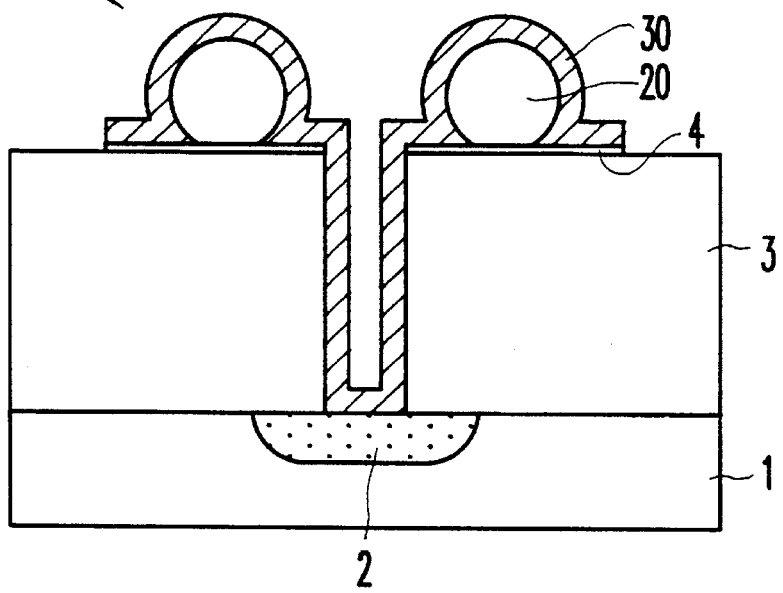

Referring to FIG. 1F, the cylindrical oxide patterns 10A are removed by a wet etching process, thereby through holes 20 at place of the patterns 10A. The exposed portion of the etching barrier layer 4 is etched by an anisotropic etching process, therefore a charge storage electrode 6A having conduits 30 is formed.

Figure 1G:
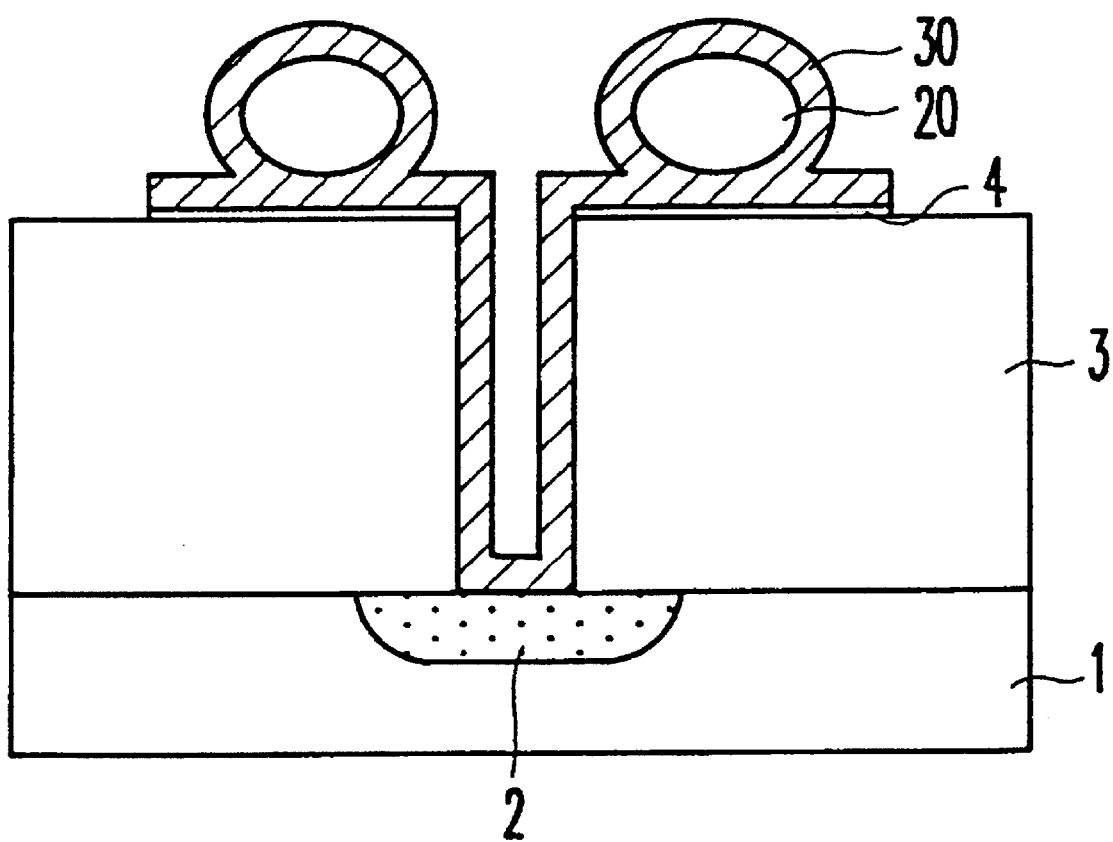
FIG. 1G is a cross-sectional view illustrating an embodiment of the present invention.

The resulting charge storage electrode 6A according to the present invention has a structure with at least two conduits 30 on the surface, such that the inner walls of the conduits 30 and the uneven surfaces of the charge storage electrode 6A increase the effective surface within the limited area. The two conduits are parallel to each other. Also, the two conduits are in the form of circular or elliptical as shown in FIGS. 1F and 1G, respectively.

The present invention, as described above, provides for a charge storage electrode having at least two conduits on the surface to increase the effective surface area by means of a relatively simple method for ease in manufacturing integrated semiconductor device.

Although this invention has been described in its preferred form with a certain degree of particularity, it is appreciated by those skilled in the art that the present disclosure of the preferred form has been made only as an example and that numerous changes in the detailed of the construction, combination and arrangement of is parts may be resorted to without departing from the spirit and scope of the invention.

What is claimed is:

1. A charge storage electrode structure formed on a silicon substrate, comprising a charge storage electrode contacting a doped region of the silicon substrate, said charge storage electrode having at least two conduits that are parallel to each other, and wherein the cross-section of said two conduits is circular in shape.

2. A charge storage electrode structure formed on a silicon substrate, comprising a charge storage electrode contacting a doped region of the silicon substrate, said charge storage electrode having at least two conduits that are parallel to each other, and wherein the cross-section of said two conduits is elliptical in shape.

3. A charge storage electrode structure of a type which is formed in contact with a doped region of a silicon substrate, comprising:

a charge storage electrode having at least two conduits that are substantially parallel to each other, wherein the cross-section of said two conduits is circular in shape and said two conduits are formed by two oxide patterns having a viscous flow property on a barrier layer which is formed on an insulating layer of said silicon substrate, said electrode formed by performing a heat treatment process so that said two oxide patterns are transformed to two cylindrical oxide patterns, and then depositing a polysilicon on a resulting structure after forming said cylindrical oxide patterns and removing said cylindrical oxide patterns.

4. A charge storage electrode structure of a type which is formed in contact with a doped region of a silicon substrate, comprising:

a charge storage electrode having at least two conduits that are substantially parallel to each other, wherein the cross-section of said two conduits is elliptical in shape and said two conduits are formed by two oxide patterns having a viscous flow properly on a barrier layer which is formed on an insulating layer of said silicon substrate, said electrode formed by performing a heat treatment process so that said two oxide patterns are transformed to two cylindrical oxide patterns, and then depositing a polysilicon on a resulting structure after forming said cylindrical oxide patterns and removing said cylindrical oxide patterns.

* * * * *